United States Patent [19]

Nagata et al.

[11] Patent Number: 4,688,139
[45] Date of Patent: Aug. 18, 1987

[54] ELECTROMAGNET DRIVE DEVICE

[75] Inventors: Osamu Nagata; Takashi Kajima, both of Kobe; Toshihara Ozaki, Osaka, all of Japan

[73] Assignee: Technological Research Association of Highly Reliable Marine Propulsion Plant, Tokyo, Japan

[21] Appl. No.: 808,108

[22] Filed: Dec. 12, 1985

[30] Foreign Application Priority Data

Dec. 12, 1984 [JP] Japan ............................. 59-262233

[51] Int. Cl.$^4$ .......................... F02B 3/00; F02M 7/00; H01H 47/32
[52] U.S. Cl. ..................................... 361/154; 123/490
[58] Field of Search ................ 361/154, 159, 194; 123/490

[56] References Cited

U.S. PATENT DOCUMENTS

| | | | |
|---|---|---|---|
| 4,291,358 | 9/1981 | Dettmann et al. | 361/154 |
| 4,319,301 | 3/1982 | Hill | 361/154 X |
| 4,377,144 | 3/1983 | Takahashi | 361/154 X |
| 4,599,674 | 7/1986 | Ishikawa et al. | 361/154 |

Primary Examiner—Michael L. Gellner
Attorney, Agent, or Firm—Cushman, Darby & Cushman

[57] ABSTRACT

A device for driving an electromagnet from a direct current source includes first and second circuits which are coupled in parallel to each other, and in parallel to a direct current source. The first circuit has a first switch, a solenoid coil, and a second switch all in series with one another. The second circuit has a third switch, a storage coil, and a fourth switch all in series with one another. A third circuit is provided which has a diode which is arranged to provide a current path from a junction between the storage coil and the fourth switch, to a junction between the first switch and the solenoid coil. In operation, during solenoid standby, the choke coil is caused to store electromagnetic energy. When the solenoid coil is energized, the switches are operated such that the energy stored in the storage coil is caused to quickly charge into the solenoid coil. The solenoid coil is maintained energized by operating the first switch in a chopper mode. To deenergize the solenoid coil, the switches are operated so that the energy in the solenoid coil is discharged into the storage coil. In this way, rapid deenergization is possible.

5 Claims, 18 Drawing Figures

ELECTROMAGNET DRIVE DEVICE

BACKGROUND AND SUMMARY OF THE INVENTION

The present invention relates to an electromagnet drive device in which a movable body of a ferromagnetic material is operated at high speed by the electromagnetic force of a coil, and more precisely relates to an electromagnet drive device for controlling for example, an electromagnetic valve for accurately carrying out fuel injection in a diesel engine or electromagnetic shut off valve.

The present invention is provided with a storage coil for electromagnetic energy connected in association with an electromagnet to energize the electromagnet, the storage coil and a solenoid coil of the electromagnet being connected in series, and a portion of the electromagnetic energy stored in said storage coil is applied to the solenoid coil, and the time from a predetermined state for the solenoid coil to be energized is made shorter. Again for electromagnet deenergizing, the storage coil and the solenoid coil of the electromagnet are connected, and a portion of the electromagnetic energy produced by the solenoid coil is applied to the storage coil, and the time for the solenoid coil to be deenergized is shortened. Therefore, the electromagnet can be driven at high speed using a relatively low supply voltage.

Figure 2:
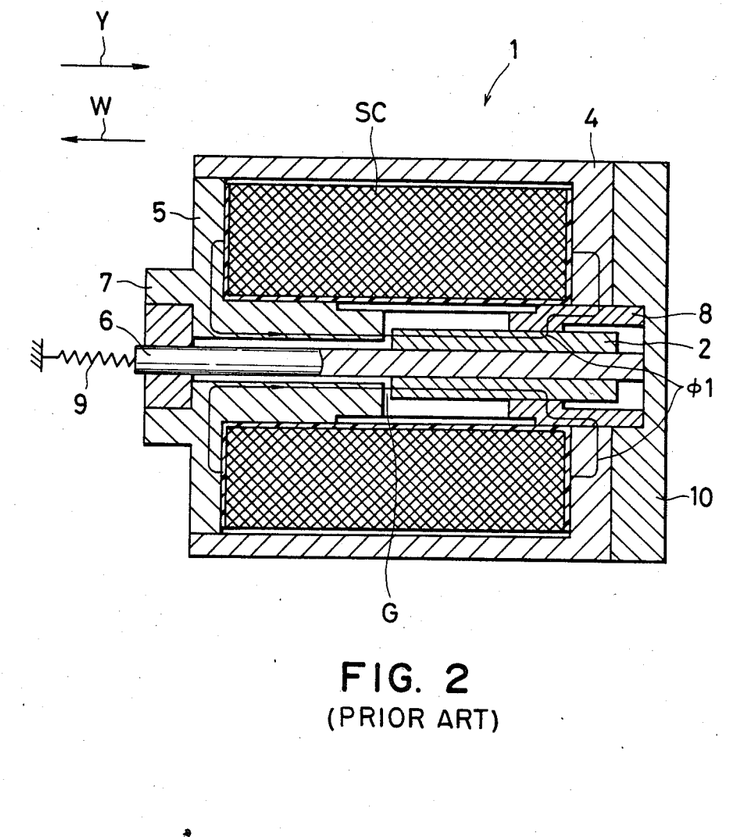
FIG. 2 is a sectional view of one example of an electromagnet 1 embodied in accordance with the present invention.
Figure 3:
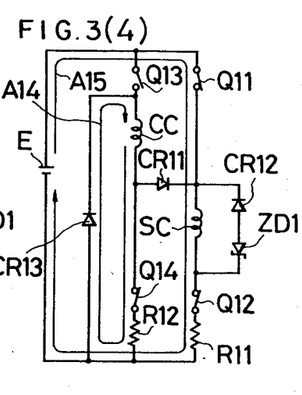

FIG. 2 is a sectional view of a typical conventional electromagnet 1 implemented in accordance with the present invention. The electromagnet 1 has, as basic structural elements, a plunger 2 which is a movable body movable in an axial direction, a solenoid coil SC wound around the plunger 2, a first yoke 4 and a second yoke 5. The plunger 2 is formed of a ferromagnetic material and is fixed to a shaft 6. Toward one end of the shaft 6 (the left end in FIG. 2) is provided a bearing 7, and a guide body 8 is provided for the plunger 2. To one end of the shaft 6 is fixed one end of a return spring 9, and the other end of the return spring 9 is fixed in a fixed position. The right end of the plunger 2 in FIG. 2 is covered by a lid 10. When the solenoid coil SC is energized, the magnetic flux flows as shown by the indication $\phi_1$, a magnetic attraction is produced in the magnetic gap G between the second yoke 5 and the plunger 2, and the plunger 2 is thereby moved in the direction of the arrow W against the spring force of the spring 9. When the coil current is removed from the solenoid coil SC, the magnetic flux disappears, and the electromagnetic attraction is dissipated. The plunger 2 is therefore moved in the direction of the arrow Y by the spring force of the spring 9, and returns to the original state.

Figure 11:
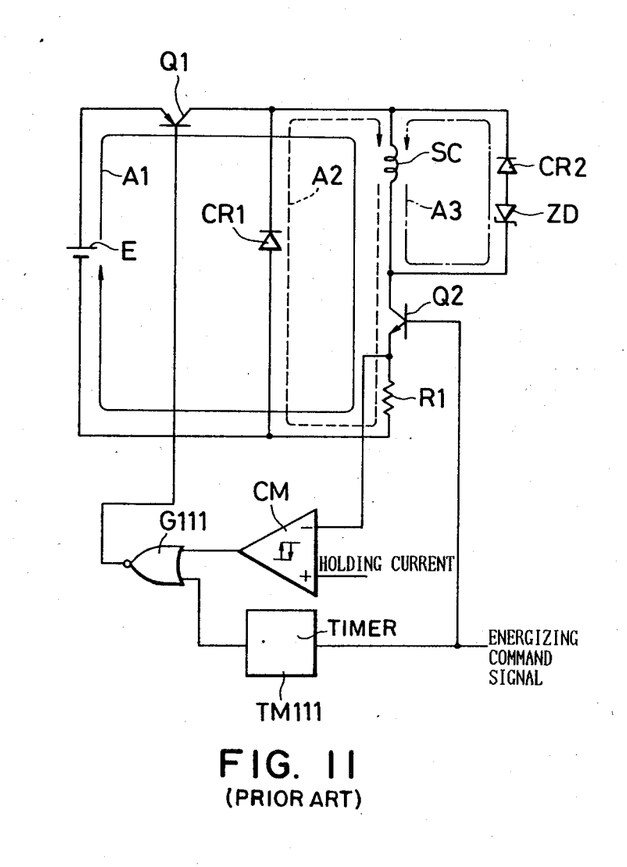
FIG. 11 is an electrical circuit diagram showing the construction of an electromagnet drive device according to conventional art.
Figure 12:
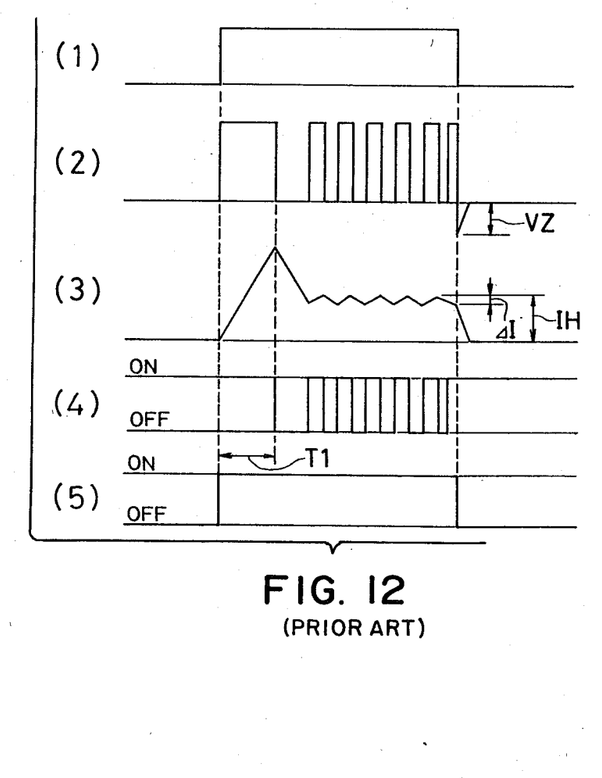
FIG. 12 is a timing chart for explaining the operation of the electromagnet drive device shown in FIG. 11.

FIG. 11 is an electrical circuit diagram of an electromagnet drive device according to existing technology driving the electromagnet 1 shown in FIG. 2, and FIG. 12 is a timing chart explaining the operation of the electromagnet drive device.

Now with regard to the electrical circuit of FIG. 11, the operation will be explained with reference to the timing chart shown in FIG. 12. In FIG. 12, (1) shows the energizing command which commands whether or not the solenoid coil SC is to be energized, (2) shows the voltage waveform applied to the coil SC, and (3) shows the waveform of the current flowing through coil SC. Signal (4) shows the operating state of the transistor Q1, and (5) shows the operating state of the transistor Q2. As shown in (1), when the energizing command signal goes from low level to high level, as shown in (5) the transistor Q2 goes on, and also the timer circuit TM111 operates. As shown in (4), for the timer set time interval T1, the transistor Q1 is forcibly held on, and a current flows in the direction of the solid line arrow A1 in FIG. 11 from the direct current supply E through the transistor Q1, solenoid coil SC, transistor Q2 and current detecting resistor R1. The current Ie cannot, because of the inductance component Ls of the solenoid coil SC, increase instantaneously, but increases gently with time t. If the voltage of the direct current supply E is Ve, and the direct current resistance component of the solenoid coil SC is Rs, then the current Ie is given by the following expression (1).

$$Ie = \frac{Ve}{Rs + R1}\left(1 - e^{-\frac{RS+R1}{Ls}t}\right) \quad (1)$$

The time interval T1 of the timer circuit TM111 is set to slightly longer than the operating time of the plunger 2 of the electromagnet 1. When this time has elapsed, the output of the timer circuit TM111 returns to low level, and as shown in FIG. 12 (4) the solenoid coil SC is driven by the output of the comparator CM in chopper mode with the transistor Q1 undergoing repeated on/off operation at a rated current of the holding current level IH. In this rated current chopper mode, the current level Ie is detected by the current detecting resistor R1. When Ie grows larger than the holding current level IH, comparator CMP changes state, causing the transistor Q1 to go off. Then, the current Ie flows through the diode CR1 and in the direction of the broken line arrow A2 in FIG. 11 and decreases. When the current Ie has become less than the holding current level IH setting by the hysteresis amplitude ΔI of the comparator, the transistor Q1 again goes on, and the current flows in the direction of the solid line arrow A1 in FIG. 11. Again the current Ie increases, and when it becomes larger than the holding current level IH setting, the operation of turning the transistor Q1 off is repeated. In other words, in the rated current chopper mode, by changing the time ratio of the on/off operation of the transistor Q1, the current Ie maintaining the attracting state of the electromagnet 1 is made equivalent to the holding current level IH, and is reduced from the current level when the plunger 2 is being moved obtained from the expression (1). Thus, the temperature increase of the solenoid coil SC is held back, and the current supply efficiency is increased.

As shown in FIG. 12 (1), when the energizing command signal goes from high level to low level the transistor Q2 goes off, and because of the back e.m.f. produced by the solenoid coil SC, the current flows in the direction of the dot-dash arrow A3 in FIG. 11 through the Zener diode ZD and diode CR2, and rapidly dissipates. At this point, if the Zener voltage of the Zener diode ZD is taken as VZ the current Ie is given by expression (2) as follows.

$$Ie = IH \cdot e^{-\frac{Ls}{Rs}t} - \left(1 - e^{-\frac{Ls}{Rs}t}\right) \cdot \frac{VZ}{Rs} \quad (2)$$

Also if the maximum surge voltage produced on the collector of transistor Q2 is VP, then this surge voltage VP is given by expression (3) as follows.

$$VP = VZ + Ve \quad (3)$$

In other words, the maximum surge voltage VP corresponding to the sum of the maximum Zener voltage VZ and the supply voltage Ve is applied to the transistor switch Q2. Therefore when the solenoid coil SC is deenergized, the higher the Zener voltage VZ the faster it is deenergized, but also the higher the surge voltage VP.

In order to increase the speed of operation of the electromagnet, the electromagnetic attraction force when pulling the plunger 2 is required to be increased rapidly, but this electromagnetic attraction force is controlled by the current Ie flowing in the solenoid coil SC. Therefore, to move the plunger 2 rapidly, the current Ie flowing in the solenoid coil SC must be increased rapidly, and also when the plunger is returning, the current flowing in the solenoid coil SC must be decreased rapidly in order not to resist the return spring 9. As shown in expression (1) and expression (2), however, abrupt changes of the current Ie are limited by the inductance Ls of the solenoid coil SC, and speeding up of the movement of the plunger 2 is hampered. If when energizing the solenoid coil SC the supply voltage Ve is increased, or when deenergizing the Zener voltage VZ is increased, then it is possible to speed up the movement of the plunger 2. The result of this, however, is not only that the transistor switches Q1 and Q2 are required to sustain higher voltages, but also that since in the rated current chopper mode the switch on operation time is very short, high speed operation switch elements are required In order further to increase the suqply voltage Ve, it becomes necessary to construct the circuit from diodes and capacitors capable of withstanding high voltage. In practical implementation of devices, there are problems with impaired economy and reliability.

The object of the present invention is the provision of an electromagnet drive device capable of operating the electromagnet at high speed even if the power supply voltage is relatively low, and having high reliability.

According to the present invention, a storage coil for electromagnetic energy connected in association with an electromagnet is provided, for electromagnet energizing, the storage coil and a solenoid coil of the electromagnet are connected in series, and a portion of the electromagnetic energy stored in said storage coil is applied to the solenoid coil, and the time from a predetermined state for the solenoid coil to be energized is made shorter. Again for electromagnet deenergizing, the storage coil and the solenoid coil of the electromagnet are connected, and a portion of the electromagnetic energy produced by the solenoid coil is applied to the storage coil, and the time for the solenoid coil to be deenergized is shortened. Therefore, the electromagnet can be driven at high speed using a relatively low supply voltage.

BRIEF DESCRIPTION OF THE DRAWINGS

FIGS. 3(1) to 3(7) are electrical circuit diagrams explaining the operation of the electromagnet drive circuit shown in FIG. 1;

DETAILED DESCRIPTION OF THE PREFERRED EMBODIMENTS

Figure 1:
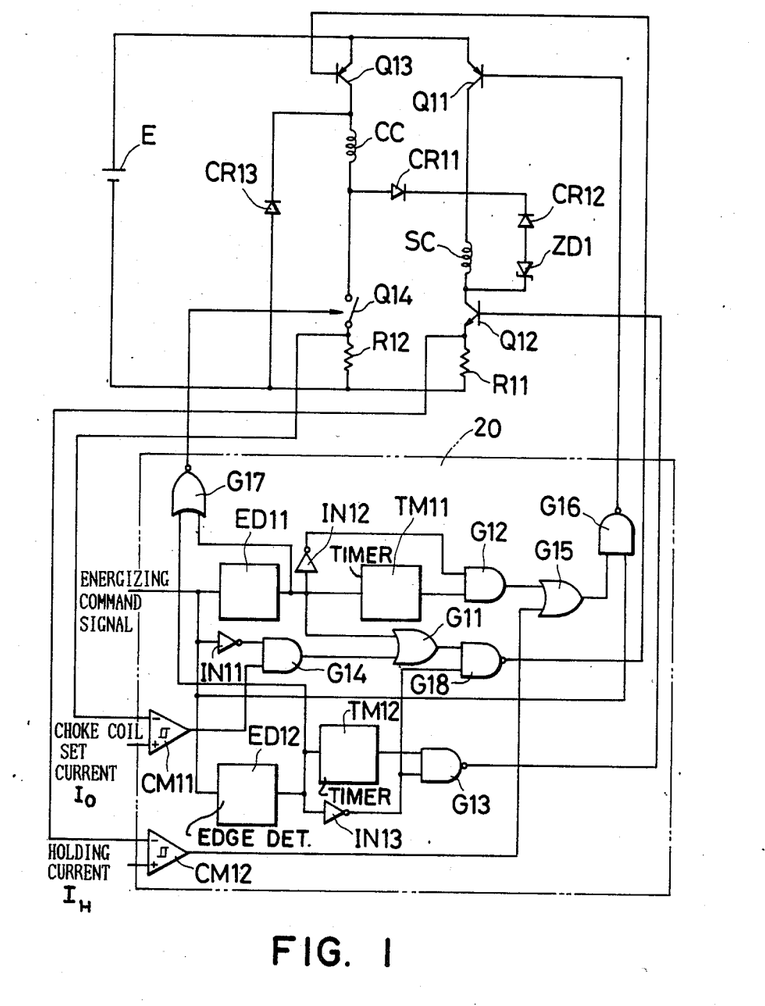
FIG. 1 is an electrical circuit diagram showing the construction of one embodiment of an electromagnet drive circuit whereby the present invention can be embodied.

FIG. 1 is a circuit diagram showing the construction of one embodiment of an electromagnet drive device of the present invention. This electromagnet drive device is used to drive an electromagnet of for example the structure shown in FIG. 2 described above, and the reference SC in FIG. 1 indicates the solenoid coil of the electromagnet to be driven.

In FIG. 1 the transistors Q11 to Q13 and the analog switch Q14 are controlled by the control circuit 20 described next.

In the control circuit 20, when the energizing command signal is input to the edge detector ED11, a high level signal for the interval T3 is instantaneously output. In the timer circuit TM11, when a high level signal is input from the edge detector ED11, a high level signal is output for the time interval T1 to one terminal of an AND gate G12. When there is a rising or falling change in the energizing command signal, the edge detector ED12 outputs a high level signal for a time interval T4. The output signal of the NOR gate G17, which is low level for an interval T3 from a rising edge of the energizing command signal and for an interval T4 from a falling edge, is applied to the control terminal of the analog switch Q14, and when low level the analog switch Q14 goes off and when high level it goes on. In the timer circuit TM12, when a high level signal is input from the edge detector ED12, a high level signal is applied for an interval T2 to one terminal of a NAND gate G13. The operation of said transistor Q12 is controlled by the output signal of the NAND gate G13, and when that output signal is a high level, the transistor Q12 goes on, and when low level it goes off. A voltage corresponding to a coil set current level ID for setting the current flowing through the coil is input to the non-inverting input terminal of a comparator CM11 having a hysteresis characteristic with a hysteresis amplitude of ΔI1. To the inverting terminal of the comparator CM11 is applied a voltage detected by said resistor R12 and corresponding to the current flowing in the coil CC, and it is compared with the voltage corresponding to said current level ID. When the voltage corresponding to said current level ID is higher, a high level signal is output, and when that voltage is lower a low level signal is output. Said transistor Q13 is controlled by the output signal of the NAND gate 18, and when the output signal is low level the transistor Q13 goes on, and when low level it goes off. A voltage corresponding to a holding current level IH for setting the current flowing through the solenoid coil SC so that the holding state of the electromagnet 1 can be maintained is input to the control circuit 20, and is input to the non-inverting input terminal of a comparator CM12 having a hysteresis characteristic with a hysteresis amplitude of ΔI2. When the voltage corresponding to said current level IH is higher a high level signal is output, and when that voltage is lower a low level signal is output.

Figure 4:
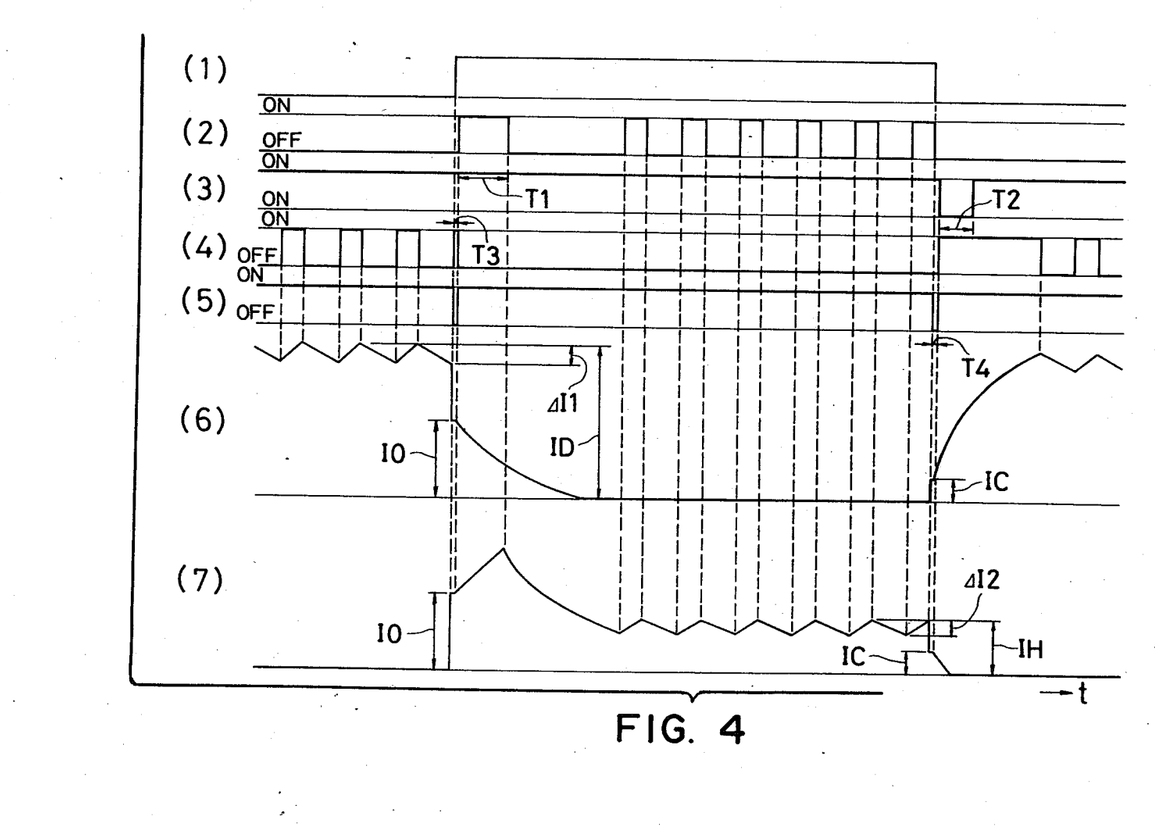
FIG. 4 is a timing chart explaining the operation of the electromagnet drive circuit shown in FIG. 1.

FIGS. 3(1)–3(7) are an explanatory diagram for explaining the operation of the electromagnet drive device shown in FIG. 1, showing the transistors Q11 to Q13 and the analog switch Q14 as switches and showing the direction of current flow for the different on/off states of the switches Q11 to Q14. FIG. 4 is a timing chart for explaining the operation of the electromagnet drive device shown in FIG. 1. In FIG. 4 (1) is shown the energizing command signal, in (2) is shown the on/off state of the switch Q11, in (3) is shown the on/off state of the switch Q12, in (4) is shown the on/off state of the switch Q13, and in (5) is shown the on/off state of the switch Q14. Again (6) shows the current waveform flowing through the coil CC, and (7) shows the current waveform flowing through the solenoid coil SC.

The operation of the electromagnet drive device will be explained with reference to FIG. 3 and FIG. 4. First the operation when as shown in FIG. 4 (1) the energizing command signal is low level and the solenoid coil SC is not energized. As shown in FIG. 3 (1) when the switch Q11 is in the off state, and switches Q12, Q13 and Q14 are in the on state, current flows from the direct current supply E to the coil CC in the direction shown by the arrow A11. The current flowing through the coil CC is detected by the current detecting resistor R12, and when it reaches the predetermined current level ID, the switch Q13 goes off, so that current flows in the direction of the arrow A12 in FIG. 3 (2) through diode CR13, the electromagnetic energy of the coil CC is dissipated in the direct current resistance component in this closed circuit, and the current flowing in the coil CC progressively decreases. When it becomes lower than the set current level ID by the hysteresis amount ΔI1, the switch Q13 goes into the on state again, and as shown in FIG. 4 (6) the switch Q13 is driven in the rated current chopper mode. During this interval, the switch Q12 is on, but the voltage drop due to the switch Q14 and current detecting resistor R12 is extremely low, so that there is almost no current flow in the solenoid coil SC side.

When the energizing command signal goes from low level to high level in order to energize the solenoid coil SC, as shown in FIG. 3 (3) the switch Q14 goes instantaneously off for an interval T3, and the current flowing in the coil CC flows in the direction shown by the arrow A13. In other words, the current flows in a circuit in series between the coil CC and the solenoid coil SC. From the well known flux linkage constancy principle of electromagnetism, "Before and after a sudden change in the circuit state, the flux linkage of that circuit is constant", the current I0 of this closed circuit is, if the inductance component of the coil CC is Ld, given by the following expression (4).

$$I0 = \frac{Ld}{Ld + Ls} \cdot ID \qquad (4)$$

In other words, the current flowing in the coil CC will, as shown in FIG. 4(4) fall instantaneously from the current level ID to the current level I0, and the current flowing in the solenoid coil SC will instantaneously rise to the same level. With existing technology, as shown in (1), the current in the solenoid coil SC rises with time t, but in the present invention, the energizing current of the solenoid coil SC is given an initial energizing value of a proportion of the current level ID of the coil CC immediately before energization corresponding to the inductance component of the solenoid coil SC, as a result of which, compared with existing technology, the time interval for the energizing current to rise can be made substantially shorter. For example, if the inductance components of the coil CC and solenoid coil SC are equal, an initial value of the energizing current of ½ of the current level ID of the coil CC is given by expression (4), and if the inductance component of the solenoid coil SC is ½ of the inductance component of the coil CC, then an initial value of the energizing current of ⅔ of the current level ID will be obtained. Thus according to the present invention, without using a high voltage for the supply voltage Ve the energizing current of the solenoid coil SC can be, nonetheless instantaneously increased.

After the switch Q14 has been off for an interval T3 as shown in FIG. 4 (5), the switch Q14 returns to the on state, and at the same time, as shown in FIG. 3 (4) the switch Q13 goes off, and the switch Q11 goes on. At this time the current flowing in the coil CC will flow in the direction shown by arrow A14 through the diode CR13 and will decrease. On the other hand, the current flowing in the solenoid coil SC in the interval T1 slightly longer than the operating time of the plunger 2 of the electromagnet 1 will flow as shown by the arrow A15 and will increase, and will become greater than the current level I0. Therefore in the present invention yet more speeding up of the movement of the plunger 2 can be obtained. At this point the current paths of the coil CC and the solenoid coil SC are cut off by the diode CR11. When the interval T1 elapses, the current detection resistor R11 detects the current flowing in the solenoid coil SC and according to that detected current value, the switch Q11 turns on/off as shown in FIG. 4 (2), and the solenoid coil SC is driven in chopper mode with a rated current of the predetermined holding current level IH. In other words, when the switch Q11 is off, the current flowing in the solenoid coil SC flows, as shown by the arrow A16 in FIG. 3 (5), in the closed circuit of switches Q12 and Q14 and diode CR11, and decreases. At this time the back e.m.f. induced at both ends of the solenoid coil SC is low, there is hardly any current flow in the circuit of the Zener diode ZD1 and diode CR12.

When the energizing command signal goes from high level to low level, as shown in FIG. 4 (2) the switch Q11 goes off, and then when the switch Q14 goes instantaneously to the off state for an interval T4, whereupon the current flowing through the solenoid coil SC flows as shown by the arrow A17 in FIG. 3 (6) through the diode CR13, the coil CC, and the diode CR11. The current Ic in this closed circuit is from the flux linkage constancy principle given by expression (5) as follows.

$$IC = \frac{Ls}{Ls + Ld} \cdot IH \qquad (5)$$

That is, when deenergizing, in the reverse way to energizing the solenoid coil SC, the current flowing in the solenoid coil SC falls from the holding current level IH to the current IC. When deenergizing, the current falls instantaneously to ½ of IH if the inductance components of the coil CC and the solenoid coil SC are equal, and to ⅓ of IH if the inductance component of the latter is ½ of the inductance component of the former. Thereafter, when as shown in FIG. 4 (3) the switch Q12 goes off, the current flowing through the solenoid coil SC in the direction shown by the arrow A18 in FIG. 3 (7) through the closed circuit of the Zener diode ZD1 and diode CR12 decreases rapidly. When the switch Q13 goes on again, the state of FIG. 3 (1) is returned to, and a current flows through the coil CC. The current Ie in FIG. 3 (7) flowing through the solenoid coil SC is given by the following expression (6).

$$Ie = IC \cdot e^{-\frac{Ls}{Rs}t} - \left(1 - e^{-\frac{Ls}{Rs}t}\right) \cdot \frac{VZ}{Rs} \qquad (6)$$

Comparing with expression (2), it will be seen that the deenergization time is reduced by substantially the ratio of the current level IH and the current level IC.

Figure 5:
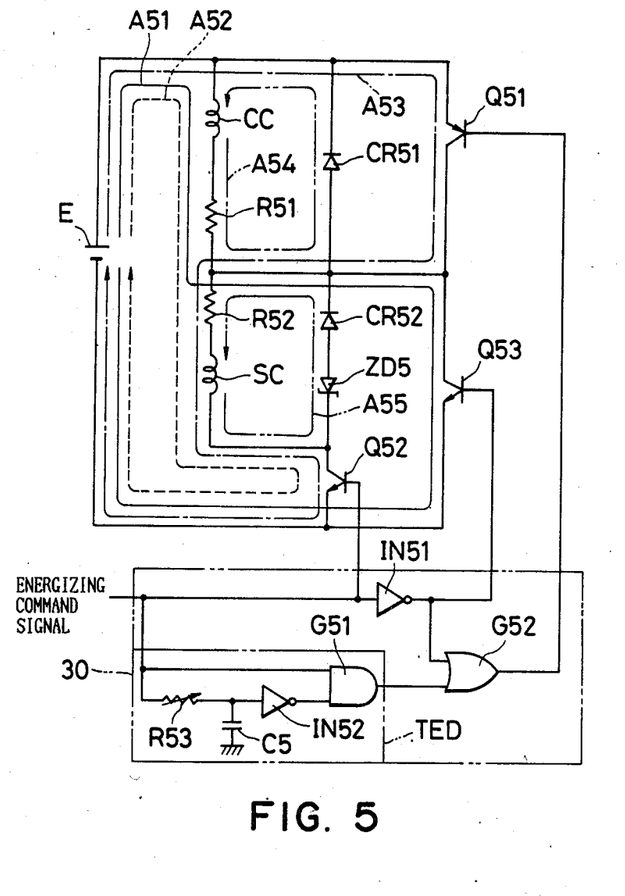
FIG. 5 is an electrical circuit diagram showing, as another embodiment, the structure of an electromagnet drive device in which the present invention is applied only when energizing the electromagnet.

FIG. 5 is an electrical circuit diagram showing, as another embodiment, the structure of an electromagnet drive device in which the present invention is applied only when energizing the electromagnet.

In FIG. 5, the transistors Q51, Q52 and Q53 are controlled by signals produced by a control circuit 30 described next.

An energizing command signal for ordering the energizing of the solenoid coil SC is input to the control circuit 30. This energizing command signal is input to an edge detector TED including a timer and a NOT circuit IN5 of the control circuit 30, and is also applied directly to the base of transistor Q52. When the input energizing command signal goes from low level to high level, this edge detector TED including a timer applies a high output for the interval TS determined by the delay circuit only to one terminal of an OR gate G52. In the NOT circuit IN51 the energizing command signal is inverted, and the output signal is applied to the base of transistor Q53 and to the other terminal of the OR gate G52. The output signal of the OR gate G52 is applied to the base of transistor Q51.

Figure 6:
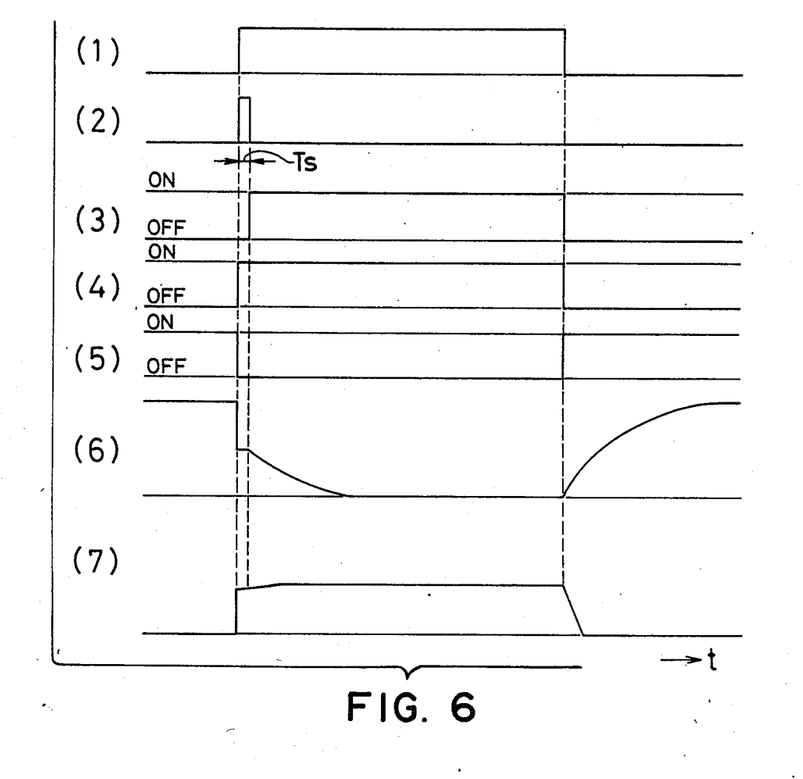
FIG. 6 is a timing chart for explaining the operation of the electromagnet drive device shown in FIG. 5.

With reference to the timing chart of FIG. 6, the operation of the electromagnet drive device of FIG. 5 will be explained. FIG. 6 (1) shows the energizing command signal and (2) shows the output signal of the AND gate G51 of the edge detector TED including timer. In (3) is shown the on/off state of transistor Q51, in (4) is shown the on/off state of transistor Q52, and in (5) is shown the on/off state of transistor Q53. (6) shows the current waveform flowing through the coil CC, and (7) shows the current waveform flowing through the solenoid coil SC. As shown in FIG. 6 (1), when the energizing command signal is low level, the transistors Q51 and Q52 are in the off state, the transistor Q53 is in the on state, and current is supplied in the direction of the solid line arrow A51 in FIG. 5 from the direct current supply E to the coil CC. At this point, the resistor R51 is, as shown in expression (1), making the rise in the energizing current of the coil CC more rapid, while also acting as a current limiting resistor for the coil CC. When the energizing command signal goes from low level to high level, as shown in FIG. 6 (4), the transistor Q52 goes from the off state to the on state, and as shown in FIG. 6 (5) the transistor Q53 goes from the on state to the off state. Also as shown in FIG. 6 (2) the output of the edge detector TED including timer goes instantaneously high for an interval Ts, and as shown in FIG. 6 (3) the transistor Q51 remains in the off state for the interval Ts and then goes to the on state. At this time, for the interval Ts the coil CC and solenoid coil SC are connected in series with respect to the direct current supply E, and the current found from the flux linkage constancy principle flows instantaneously in the direction shown by the broken line arrow A52 in FIG. 5. Once the instantaneous interval Ts has elapsed, the transistor Q51 goes into the on state, and in order that the current flowing in the solenoid coil SC does not decrease, current is supplied from the direct current supply E in the direction shown by the dot-dash line arrow A53 in FIG. 5. The resistor R52 is for the purpose of setting this holding current The current flowing in the coil CC flows in the direction of the dot-dot-dash line arrow A54 in FIG. 5, through the diode CR51, and gradually decreases.

As shown in FIG. 6 (1), when the energizing command signal is switched from high level to low level, the transistors Q51 and Q52 go, as shown in FIG. 6 (3) and (4), from the on state to the off state, and as shown in FIG. 6 (5) the transistor Q53 goes from the off state to the on state. At this point, the current flowing in the solenoid coil SC flows in the direction shown by the dot-dot-dash line arrow A55 in FIG. 5 through the deenergizing circuit of the Zener diode ZD5 and diode CR52, and is rapidly dissipated. On the other hand, the current flowing in the coil CC flows in the direction of the solid line arrow A51 in the drawing, and progressively increases to return to the initial state.

Figure 7:
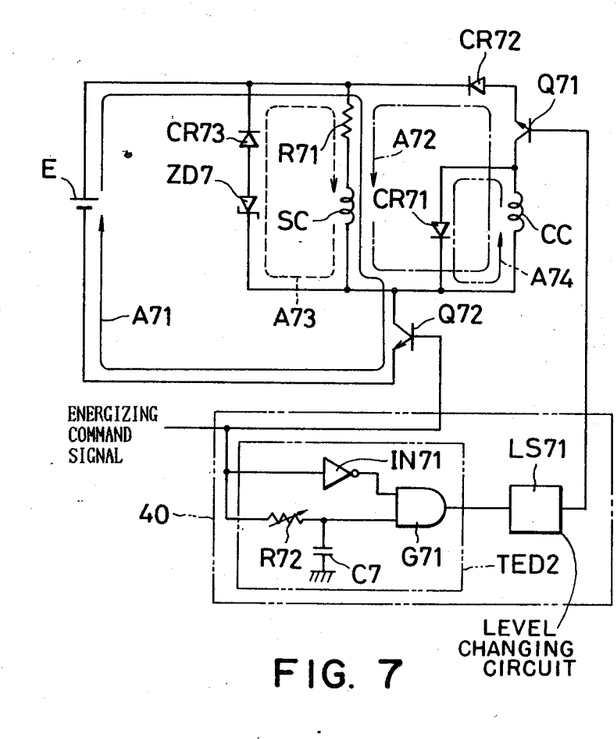
FIG. 7 is an electrical circuit diagram showing, as another embodiment, the structure of an electromagnet drive device in which the present invention is applied only when deenergizing the electromagnet.

FIG. 7 is an electrical circuit diagram showing, as another embodiment, the structure of an electromagnet drive device in which the present invention is applied only when deenergizing the electromagnet. In FIG. 7, the transistors Q71 and Q72 are controlled by signals produced by the control circuit 40 described next.

An energizing command signal for ordering the energizing of the solenoid coil SC is input to the control circuit 40. This energizing command signal is input to an edge detector TED2 including a timer of the control circuit 40, and is also applied directly to the base of transistor Q72. When the input energizing command signal goes from high level to low level, the edge detector TED2 including a timer applies a high output for the interval Tf determined by the delay circuit only to a level changing circuit LS71. The level changing circuit applies a signal greater than the emitter potential of the transistor Q71 to its base, and turns the transistor Q71 on.

Figure 8:
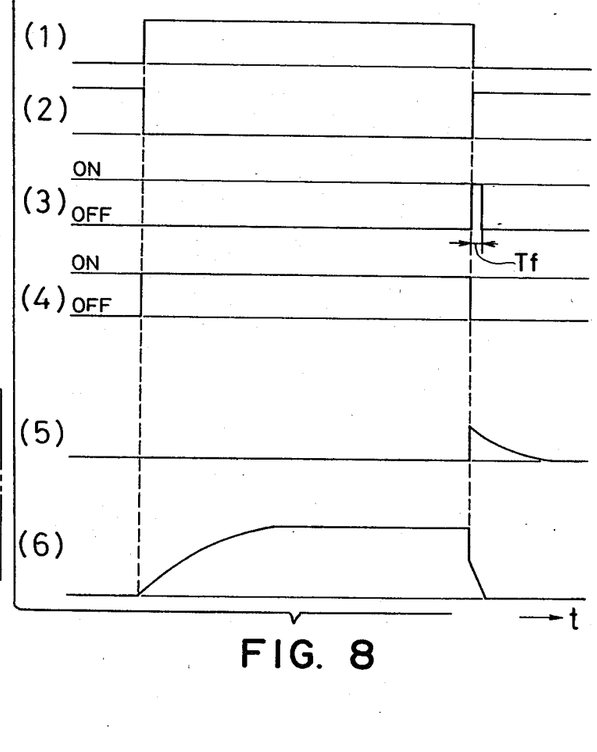
FIG. 8 is a timing chart for explaining the operation of the electromagnet drive device shown in FIG. 7.

With reference to the timing chart of FIG. 8, the operation of the electromagnet drive device of FIG. 7 will be explained. FIG. 8 (1) shows the energizing command signal and (2) shows the output signal of the NOT circuit IN71 of the edge detector TED21 including timer. In (3) is shown the on/off state of transistor Q71, and in (4) is shown the on/off state of transistor Q72. (5) shows the current waveform flowing through the coil CC, and (6) shows the current waveform flowing through the solenoid coil SC. When the energizing command signal is low level, the transistors Q71 and Q72 are in the off state, and no current flows through any path. When the energizing command signal goes from low level to high level as shown in FIG. 8 (1), the transistor Q71 remains in the off state as shown in FIG. 8 (3), but the transistor Q72 goes on as shown in FIG. 8 (4), and a current flows from the direct current supply E in the direction shown by the solid line arrow A71 if FIG. 7, and the solenoid coil SC is energized. The resistor R71 is provided to, from expression (1), make the rise in the current flowing in the solenoid coil SC when energizing more rapid, and also set the holding current for maintaining the attraction of the plunger by the electromagnet. When the energizing command signal switches from high level to low level as shown in FIG. 8 (1), the transistor Q72 switches from on to off as shown in FIG. 8 (4), and as shown in FIG. 8 (3) the transistor Q71 goes on for an interval Tf because the output signal of the edge detector TED including a timer goes instantaneously high level for an interval Tf. At this point current flows in the direction shown by the dot-dash line arrow A72 in FIG. 7, as shown in FIG. 8 (6) the current flowing in the solenoid coil SC reduces rapidly to the instantaneous value found from the flux linkage constancy principle, and on the other hand the current flowing in the coil CC increases rapidly as shown in FIG. 8 (5). As shown in FIG. 8 (3), after the interval Tf has elapsed the transistor Q71 returns from the on state to the off state, whereupon the current flowing in the solenoid coil SC flows in the direction shown by the broken line arrow A73 in FIG. 7 through the Zener diode ZD7 and diode CR73, and reduces rapidly. The current flowing through the coil CC flows in the direction shown by the dot-dot-dash line arrow A74 in FIG. 7 through the diode CR71, and gradually decreases, so that all the currents in the circuit are dissipated and the initial state is returned to. The diode CR72 is provided to protect the transistor Q71 when energizing the solenoid coil SC.

Figure 9:
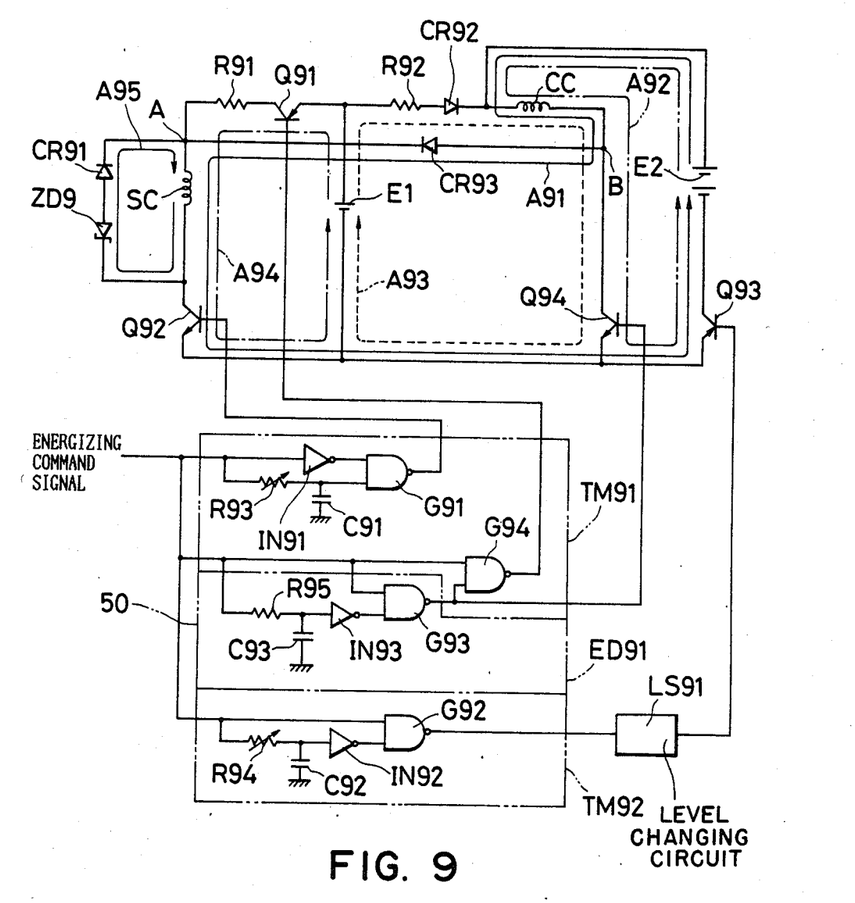
FIG. 9 is an electrical circuit diagram showing, as another embodiment, the structure of an electromagnet drive device in which the present invention is applied only when energizing the electromagnet and when the frequency of repeating the energizing commands is very high.

FIG. 9 is an electrical circuit diagram showing, as another embodiment, the structure of an electromagnet drive device in which the present invention is applied only when energizing the electromagnet and when the frequency of repeating the energizing commands is very high. In FIG. 9, the transistors Q91 to Q94 are controlled by signals produced by the control circuit 50. An energizing command signal for ordering the energizing of the solenoid coil SC is input to the control circuit 50. This energizing command signal is input to timer circuits TM91 and TM92 and to an edge detector ED91 of the control circuit 50. When the input energizing command signal goes from high level to low level, the timer circuit TM91 applies a low output for the interval Ta determined by the delay circuit only to the base of transistor Q92, and the transistor Q92 goes off. When the input energizing command signal goes from low level to high level, the timer circuit TM92 applies a low output for the interval Tb determined by the delay circuit only through a level changing circuit LS91 to the base of transistor Q93, and the transistor Q93 goes on. When the input energizing command signal goes from low level to high level, the edge detector ED91 applies a low output for the instantaneous interval Tc determined by the delay circuit only to the base of transistor Q94, and the transistor Q94 goes off. The output of the edge detector ED91 is also applied to one terminal of a NAND gate G94, to the other terminal of the NAND gate G94 is applied directly the energizing command signal, and the output signal of the NAND gate G94 is applied to the base of transistor Q92.

Figure 10:
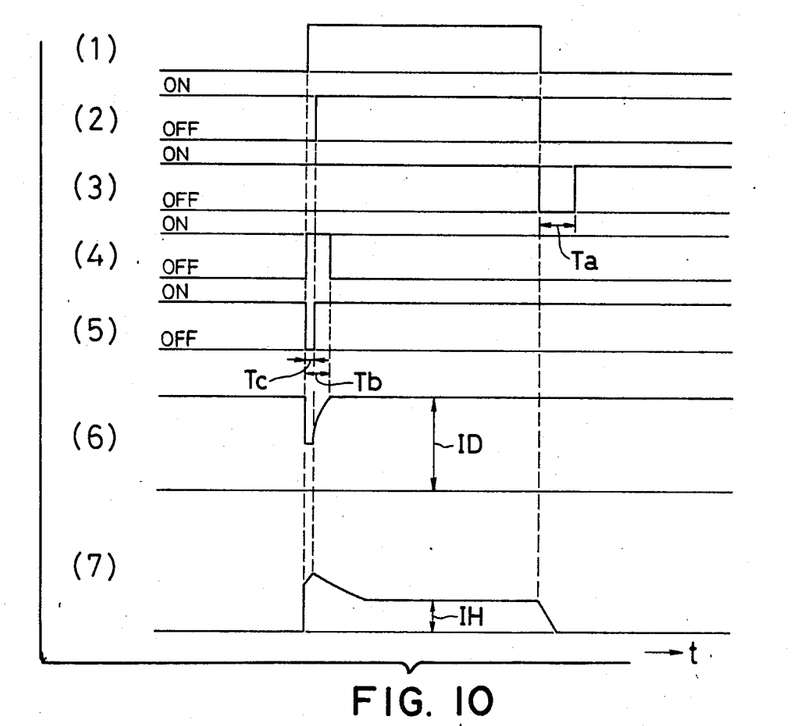
FIG. 10 is a timing chart for explaining the operation of the electromagnet drive device shown in FIG. 9.

FIG. 10 is a timing chart for explaining the operation of the electromagnet drive device shown in FIG. 9. In FIG. 10 (1) is shown the energizing command signal, in FIG. 10 (2) is shown the on/off state of switch Q91, in FIG. 10 (3) is shown the on/off state of switch Q92, in FIG. 10 (4) is shown the on/off state of switch Q93, and in FIG. 10 (5) is shown the on/off state of switch Q94. FIG. 10 (6) shows the current waveform flowing in the coil CC and FIG. 10 (7) shows the current waveform flowing in the solenoid coil SC. With reference to the timing chart of FIG. 10, the operation of the electromagnet drive device of FIG. 9 will be explained. When the energizing command signal is low level, as shown in FIG. 10 (1) to (4), the transistor Q91 is in the off state, the transistor Q92 is in the on state, the transistor Q93 is in the off state, and the transistor Q94 is in the on state, and current is supplied as shown by the broken line arrow A93 from the low voltage supply E1 through resistor R92 and diode CR92. The resistor R92 and coil CC are provided to set the standby energizing current ID. When the energizing command signal changes from low level to high level as shown in FIG. 10 (1), the transistor Q94 goes, as shown in FIG. 10 (5), from the on state to the off state for the interval Tc, the transistor Q92, as shown in FIG. 10 (3), remains in the on state, and the transistor Q93 goes, as shown in FIG. 10 (4), from the off state to the on state for just the interval TB. At this time the current path is in the direction shown by the solid line arrow A91 in FIG. 9, through the high voltage direct current supply E2, the coil CC, the diode CR93, the solenoid coil SC, and the transistors Q92 and Q93, and by the flux linkage constancy principle, the current flowing in the coil CC decreases instantaneously, and the current flowing in the solenoid coil SC increases instantaneously. The diode CR92 is provided to prevent any current flow from the high voltage direct current supply E2 to the low voltage direct current supply E1. The current in the solenoid coil SC rises instantaneously at the interval Tc, and then the transistor Q94 goes on as shown in FIG. 10 (5), and the transistor Q91 goes on as shown in FIG. 10 (2). Since the transistor Q91 goes on, the connection A of the solenoid coil SC is at the same potential as the low voltage supply E1, whereas the connection B of the coil CC is shorted to the minus side of the low voltage supply E1 through the transistor Q94, as a result of which the diode CR93 is reverse biased and is cut off. A current flows to the coil CC in the direction shown by the dot-dot-dash line arrow A92 in FIG. 9 from the high voltage direct current supply E2, and once again the current flowing through the coil CC increases. After the interval TB has elapsed the transistor Q93 goes off, and this time current flows in the direction shown by the broken line arrow A93 in FIG. 9 from the low voltage direct current supply E1, and the current flowing in the coil CC returns, as shown in FIG. 10 (6), to the energizing standby current ID. The time interval TB set by the timer TM92 is made slightly longer than the time interval to restore the standby energizing current ID to the coil CC. On the other hand, the transistor Q92 goes on, and the holding current IH set by the resistor R91 is supplied to the solenoid coil SC in the direction shown by the dot-dash line arrow A94 in FIG. 9 from the low voltage supply E1.

When as shown in FIG. 10 (1) the energizing command signal changes from the high level to the low level, as shown in FIG. 10 (2) the transistor switch Q91 goes from the on state to the off state, and as shown in FIG. 10 (3) the transistor Q92 goes off for the interval Ta set by the timer circuit TM92, and after the interval Ta has elapsed returns to the on state. In the interval Ta, the current flowing in the solenoid coil SC flows in the direction shown by the solid line arrow A95 in FIG. 9 through the Zener diode ZD9 and diode CR91, and dissipates rapidly. The interval Ta is set such that the transistor Q92 will return to the on state after the current flowing in the solenoid coil SC has completely dissipated. In this way the initial state is returned to.

In the present invention there is a standby energizing current ID flowing in the coil CC except during the short interval Tb immediately after the energizing command signal has switched from low level to high level, and therefore the present invention can be applied even when the frequency of the energizing command signal is high.

As above, according to the present invention, using a relatively low supply voltage and with high reliability, it is possible to operate an electromagnet drive device at high speed.

What is claimed is:

1. A device for driving an electromagnet from a direct current source, comprising:
    first means in parallel coupled to said DC current source, including a first switch, a solenoid coil and a second switch, all connected in series;
    second means, coupled in parallel to said first means, including a third switch, storage coil means for storing electromagnetic energy, and a fourth switch all connected in series;
    third means, coupled between said first and second means including a diode connecting a junction between said storage coil means and said fourth switch to a junction between said first switch and said solenoid coil; and
    controlling means for: (1) operating said first and second means, during a standby time of the solenoid coil, to store electromagnetic energy in said storage coil means, (2) operating said first and second means at a time of energizing said solenoid coil so that said stored electromagnetic energy in said storage coil means is rapidly discharged into said solenoid coil, (3) operating said first switch in a chopper mode in which said first switch is alternately turned on and off, to maintain the solenoid in its energized state, and (4) connecting said switches, at a time of discharging said solenoid coil, so that electromagnetic energy in said solenoid coil is discharged into said storage coil means.

2. A device for driving an electromagnet from a direct current source, comprising:
    first means coupled in parallel to said DC current source, including a first switch, a solenoid coil and a second switch all connected in series;
    second means, coupled in parallel to said first means, including a third switch, storage coil means for storing electromagnetic energy, and a fourth switch all connected in series;
    third means, coupled between said first and second means, including a first a diode connecting a junction between said storage coil means and said fourth switch to a junction between said first switch and said solenoid coil; and
    controlling means for (1) during a time of stand-by of the solenoid, rendering the first switch OFF, the second switch ON, the third switch into a CHOPPER MODE which repeats alternately ON and OFF, and the fourth switch ON, (2) at a time of energizing the solenoid coil, rendering the first switch ON for a first predetermined time, the second switch ON, the third switch ON for a short time, and the fourth switch OFF for a short time, (3) at a time of maintaining the solenoid, rendering the first switch into said CHOPPER MODE repeating alternately ON and OFF, the second switch ON, the third switch OFF, and the fourth switch ON, and (4) at a time of de-energizing the solenoid coil, rendering the first switch OFF, the second switch OFF after the lapse of a short time, the third switch ON after the lapse of a short time, and the fourth switch OFF for a short time.

3. An apparatus as in claim 2, wherein said third means further comprises a second diode coupling from a junction between said second and fourth switches, to a junction between said third switch and said storage coil means, so that when said second switch closes and said fourth switch is open, current can flow through said second diode from said solenoid coil to said storage coil means to enable a rapid discharge.

4. An apparatus as in claim 3, further comprising a back-biased diode, coupled in parallel with said solenoid coil having a polarity opposite to a direction of energizing current, and a non-linear element which conducts when back EMF produced by said solenoid coil exceeds a fixed value.

5. An apparatus as in claim 3, wherein said controlling means includes chopper means for turning on and off respective ones of said switches.

* * * * *